(12) United States Patent
Jiang

(10) Patent No.: US 10,593,791 B2
(45) Date of Patent: Mar. 17, 2020

(54) SEMICONDUCTOR STRUCTURE WITH CURRENT FLOW PATH DIRECTION CONTROLLING

(71) Applicant: Chii-Wen Jiang, Hsinchu (TW)

(72) Inventor: Chii-Wen Jiang, Hsinchu (TW)

( * ) Notice: Subject to any disclaimer, the term of this patent is extended or adjusted under 35 U.S.C. 154(b) by 0 days.

(21) Appl. No.: 16/153,686

(22) Filed: Oct. 5, 2018

(65) Prior Publication Data

US 2020/0052105 A1    Feb. 13, 2020

(30) Foreign Application Priority Data

Aug. 9, 2018   (TW) .............................. 107127863 A

(51) Int. Cl.
*H01L 29/78*    (2006.01)
*H01L 27/07*    (2006.01)
*H01L 29/06*    (2006.01)

(52) U.S. Cl.
CPC ...... *H01L 29/7803* (2013.01); *H01L 27/0705* (2013.01); *H01L 29/0649* (2013.01)

(58) Field of Classification Search
CPC ............. H01L 29/7803; H01L 29/0649; H01L 27/0705
USPC .......................................................... 257/268
See application file for complete search history.

(56) References Cited

U.S. PATENT DOCUMENTS

| 2009/0166721 A1* | 7/2009 | Denison | H01L 27/0262 257/328 |
| 2010/0038711 A1* | 2/2010 | Hsieh | H01L 29/0619 257/331 |
| 2013/0328103 A1* | 12/2013 | Salcedo | H01L 27/0262 257/121 |
| 2014/0145292 A1* | 5/2014 | Jiang | H01L 21/265 257/496 |
| 2016/0087034 A1* | 3/2016 | You | H01L 29/7811 257/390 |

FOREIGN PATENT DOCUMENTS

| TW | 200725889 A | 7/2007 |
| TW | 201351637 A | 12/2013 |
| TW | 201824368 A | 7/2018 |

* cited by examiner

*Primary Examiner* — Karen Kusumakar
*Assistant Examiner* — Adam S Bowen
(74) *Attorney, Agent, or Firm* — IPR Works, LLC

(57) ABSTRACT

A semiconductor structure with current flow path direction controlling is provided, which comprises a substrate and an epitaxial layer having a first conductivity type on the substrate. A first doped region is on the substrate and the first doped region has the first or a second conductivity type. A second doped region is enclosed by the epitaxial layer and has the second conductivity type. A third doped region is located in the epitaxial layer and between the first and second doping regions, and the third doped region has the second conductivity type. A fourth doped region is enclosed by the third doped region and has the first conductivity type. A fifth doped region is enclosed by the first doped region and the conductivity type is opposite to that of the first doped region.

9 Claims, 17 Drawing Sheets

SEMICONDUCTOR STRUCTURE WITH CURRENT FLOW PATH DIRECTION CONTROLLING

This application claims priority for Taiwan patent application no. 107127863 filed on Aug. 9, 2018, the content of which is incorporated by reference in its entirety.

BACKGROUND OF THE INVENTION

Field of the Invention

The present invention relates to a semiconductor structure, particularly to a semiconductor structure with current flow path direction controlling.

Description of the Related Art

In the conventional semiconductor devices, the power consumption is decreased or the application efficiency of the semiconductor elements is increased to lower the forward bias generated in operation or reduce the current crowding effect. However, the performance of the semiconductor devices using planar interfaces is hard to further improve except via more sophisticated structure design or innovative semiconductor design.

In the conventional innovative semiconductor design, the measures of shortening the length of the drift zone, lowering the resistance of the drift zone, enhancing the current spreading effect, etc. are used to lessen the current crowding effect and lower the forward operating voltage. Further, some approaches, such as an anti-electrostatic discharge method and a high temperature method, may be used to maintain high breakdown voltage in active zones, decrease leakage current, and increase reliability of elements.

Some schemes of structural improvements, such forming a stage type interface to terminate extension structures, may improve the deficiencies of the conventional planar interface semiconductor devices. However, the improved structure and the technology of varying drift zone length are hard to effectively control the flow direction of current but likely to make the current flowing through the semiconductor structure diffuse to other doped zones and induce the instability of the current flowing through the semiconductor device.

Accordingly, the present invention proposes a semiconductor structure with current flow path direction controlling to effectively control the current transmission path, whereby the current transmitted in a semiconductor structure would not effuse from edges while electronic elements are connected.

SUMMARY OF THE INVENTION

The primary objective of the present invention is to provide a semiconductor structure with current flow path direction controlling, wherein identical or different conductivity types of doped regions are used to control the current flow path in the overall structure, whereby to prevent from too high current consumption caused by that the current flow direction cannot be effectively controlled.

Another objective of the present invention is to provide a semiconductor structure with current flow path direction controlling, which is applicable to various types of electronic devices, such as memories and microprocessors, and able to upgrade the performance of electronic products.

In order to achieve the abovementioned objectives, the present invention proposes a semiconductor structure with current flow path direction controlling, which comprises a substrate; an epitaxial layer on the substrate and of a first conductivity type; a first doped region on the substrate and at one side of the epitaxial layer, wherein the first doped region is of the first conductivity type or a second conductivity type; a second doped region in the epitaxial layer and enclosed by the epitaxial layer, wherein the second doped region is of the second conductivity type, and wherein the top of the second doped region is revealed from the top of the epitaxial layer; a third doped region in the epitaxial and between the second doped region and the first doped region, wherein the epitaxial layer separates the third doped region, the second doped region, and the first doped region, and wherein the top of the third doped region is revealed from the top of the epitaxial layer, and wherein the third doped region is of the second conductivity type; a fourth doped region in the third doped region and enclosed by the third doped region, wherein the top of the fourth doped region is revealed from the top of the third doped region, and wherein the fourth doped region is of the first conductivity and a fifth doped region in the first doped region and enclosed by the first doped region, wherein the top of the fifth doped region is revealed from the top of the first doped region, and wherein the fifth doped region is of a conductivity type opposite to the conductivity of the first doped region. While the substrate receives a current, the current may be selectively transmitted from the first, second, third, fourth or fifth doped region, whereby the flow path of the current can be controlled.

In the present invention, the first conductivity type is an n conductivity type, and the second conductivity type is a p conductivity type; alternatively, the first conductivity type is a p conductivity type, and the second conductivity type is an n conductivity type.

In the present invention, the substrate is of the first conductivity type or the second conductivity type.

In the present invention, connection elements are selectively arranged on the tops of the epitaxial layer, the first, second, third, fourth and fifth doped regions. The epitaxial layer, the first, second, third, fourth and fifth doped regions are selectively electrically connected through the connection elements.

In the present invention, each of the connection elements may be a PN diode, a Schottky diode, a fast recovery diode (FRD), a transistor, a thyristor, a metal-oxide-semiconductor field-effect-transistor (MOSFET), or an insulated gate bipolar transistor (IGBT).

In the present invention, separation regions are annularly arranged around the first, second, and third doped regions to prevent current from straying to the exterior of the first, second, and third doped regions. A reactive-ion etching (RIE) process is used to etch a dielectric material, a polysilicon material or an amorphous silicon material to form the separation regions. The angle of the sidewall of the separation region ranges from 55 to 125 degrees.

Below, embodiments are described in detail in cooperation with the attached drawings to make easily understood the objectives, technical contents, characteristics and accomplishments of the present invention.

DETAILED DESCRIPTION OF THE INVENTION

At present, core units of most electronic products, such as computers, smart phones and digital electronic devices, are closely related with semiconductor. Therefore, the role of semiconductor is unsubstitutable. The conventional improvements of semiconductor devices have significant influence on the upgrade of the performance of electronic products. The present invention can effectively control the current flow path lest unnecessary mutual interference appear during current transmission in the semiconductor structure.

Figure 1:
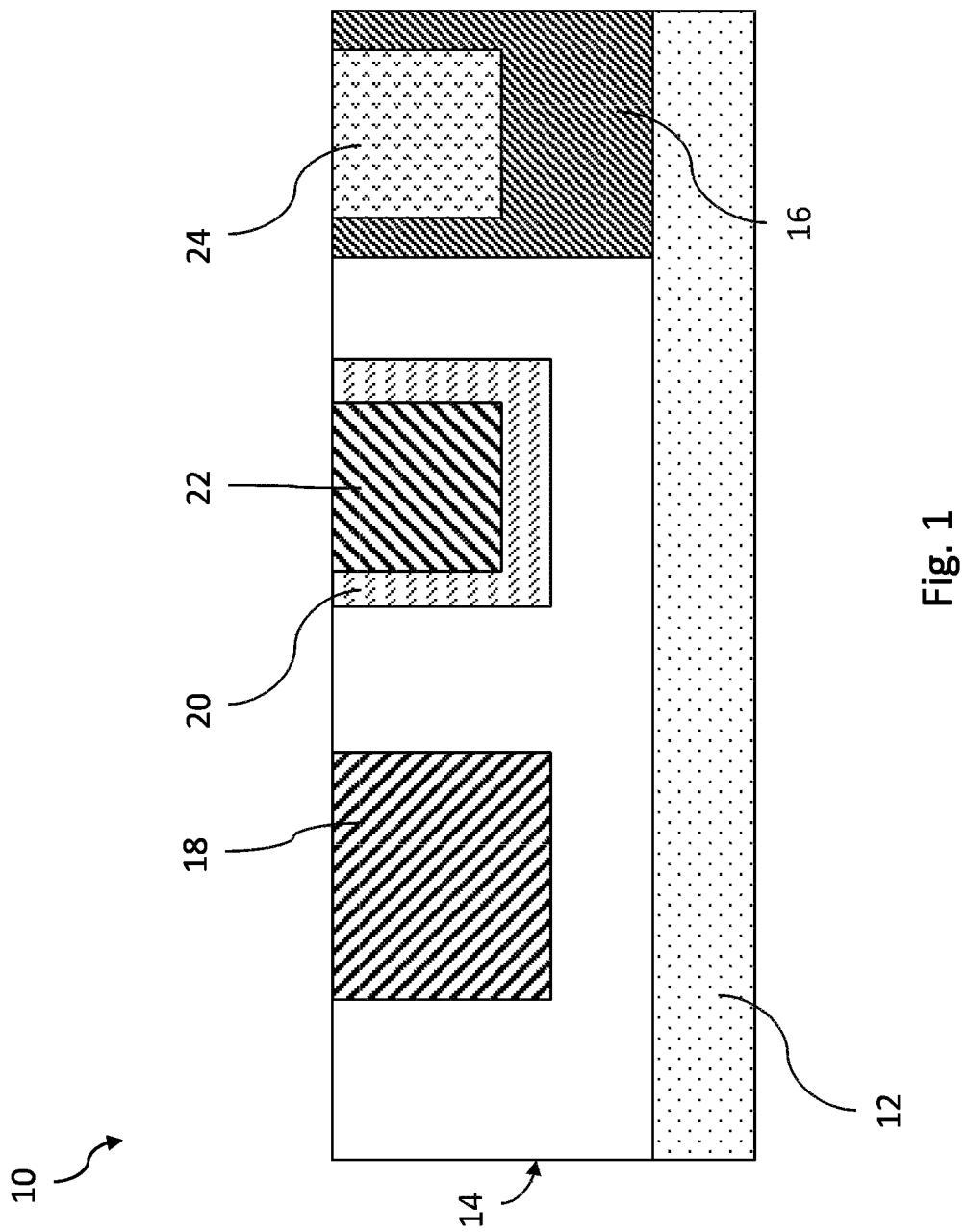
FIG. 1 is a diagram schematically the structure of a semiconductor structure with current flow path direction controlling according to a first embodiment of the present invention.

Refer to FIG. 1 for a first embodiment of the present invention. The semiconductor structure 10 with current flow path direction controlling of the present invention comprises a substrate 12; an epitaxial layer 14 on the substrate 12; a first doped region 16 on the substrate 12 and at one side of the epitaxial layer 14; a second doped region 18 in the epitaxial layer 14 and enclosed by the epitaxial layer 14, wherein with the top of the second doped region 18 is revealed from the top of the epitaxial layer 14; a third doped region 20 in the epitaxial layer 14 and between the first doped region 16 and the second doped region 18, wherein the first doped region 16, the second doped region 18 and the third doped region 20 are separated by the epitaxial layer 14, and wherein the top of the third doped region 18 is revealed from the top of the epitaxial layer 14; a fourth doped region 22 in the third doped region 20 and enclosed by the third doped region 20, wherein the top of the fourth doped region 22 is revealed from the top of the third doped region 20; and a fifth doped region 24 in the first doped region 16 and enclosed by the first doped region 16, wherein the top of the fifth doped region 24 is revealed from the top of the first doped region 16. The present invention neither particularly limits the shapes, depths, or dopant concentrations of the doped regions nor particularly limits the heights by which the doped regions protrude. The first embodiment is to disclose the positional relationships of the doped regions. However, the present invention is not limited by the first embodiment.

The epitaxial layer 14 is of a first conductivity type. The first doped region 16 is of the first conductivity type or a second conductivity type. The second doped region 18 is of the second conductivity type. The third doped region 20 is of the second conductivity type. The fourth doped region 22 is of the first conductivity type. The fifth doped region 24 is of a conductivity type opposite to the conductivity type of the first doped region 16. While the first doped region 16 is of the first conductivity type, the fifth doped region 24 is of the second conductivity type. While the first doped region 16 is of the second conductivity type, the fifth doped region 24 is of the first conductivity type. In the present invention, while the first conductivity type is an n conductivity type, the second conductivity type is a p conductivity type. While the first conductivity type is a p conductivity type, the second conductivity type is an n conductivity type. In the present invention, the substrate 12 may be of a first or second conductivity type. The present invention does not demand that the conductivity type of the substrate 12 must be the same as that of any one of the other components.

For example, while the epitaxial layer 14 is of the first (n) conductivity type, the substrate 12 may be of the same or a different conductivity type. In other words, the substrate 12 may be of the first (n) conductivity type or the second (p) conductivity type. The conductivity type of the substrate is not particularly limited by the present invention but dependent on the design of the user. The present invention demands that the conductivity type of the second doped region 18 and the third doped region 20 in the epitaxial layer 14 must be opposite to the conductivity type of the epitaxial layer 14. In the case that the epitaxial layer 14 is of the first (n) conductivity type, the second doped region 18 and the third doped region 20 must be of the second (p) conductivity type. However, the first doped region 16 at one side of the epitaxial layer 14 may be of the first (n) conductivity type or the second (p) conductivity type. In the case that the first doped region 16 is of the second (p) conductivity type, the fifth doped region 24 must be of the first (n) conductivity type. The abovementioned embodiments are only to exemplify the present invention but not to limit the scope of the present invention. The present invention does not limit that the epitaxial layer 14, first doped region 16, second doped region 18, third doped region 20, fourth doped region 22 and fifth doped region 24 must be of the n or p type conductivity but limits that the conductivity types thereof must match some relationships.

Figure 2:
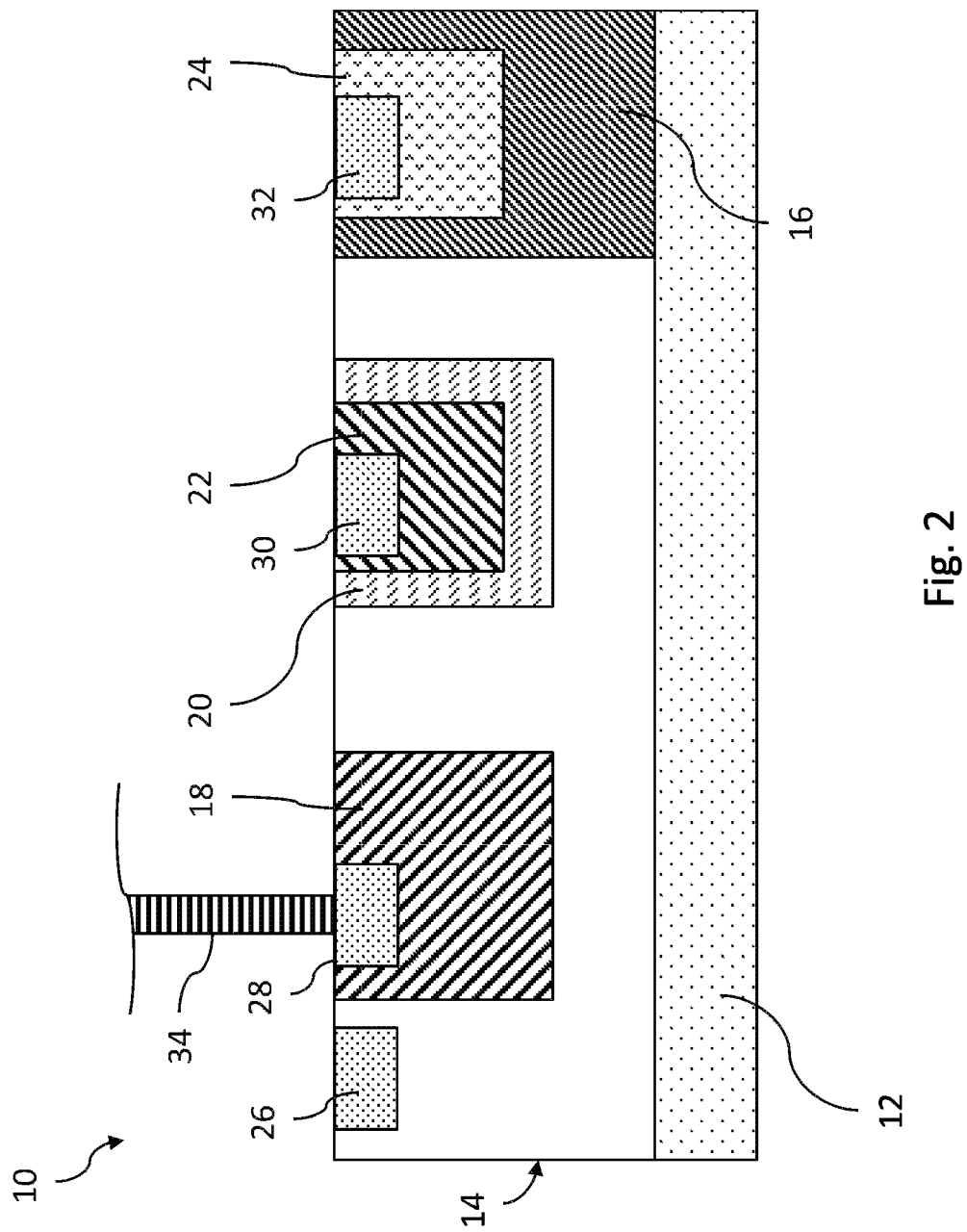
FIG. 2 is a diagram schematically the structure of a semiconductor structure with current flow path direction controlling according to a second embodiment of the present invention.
Figure 3:
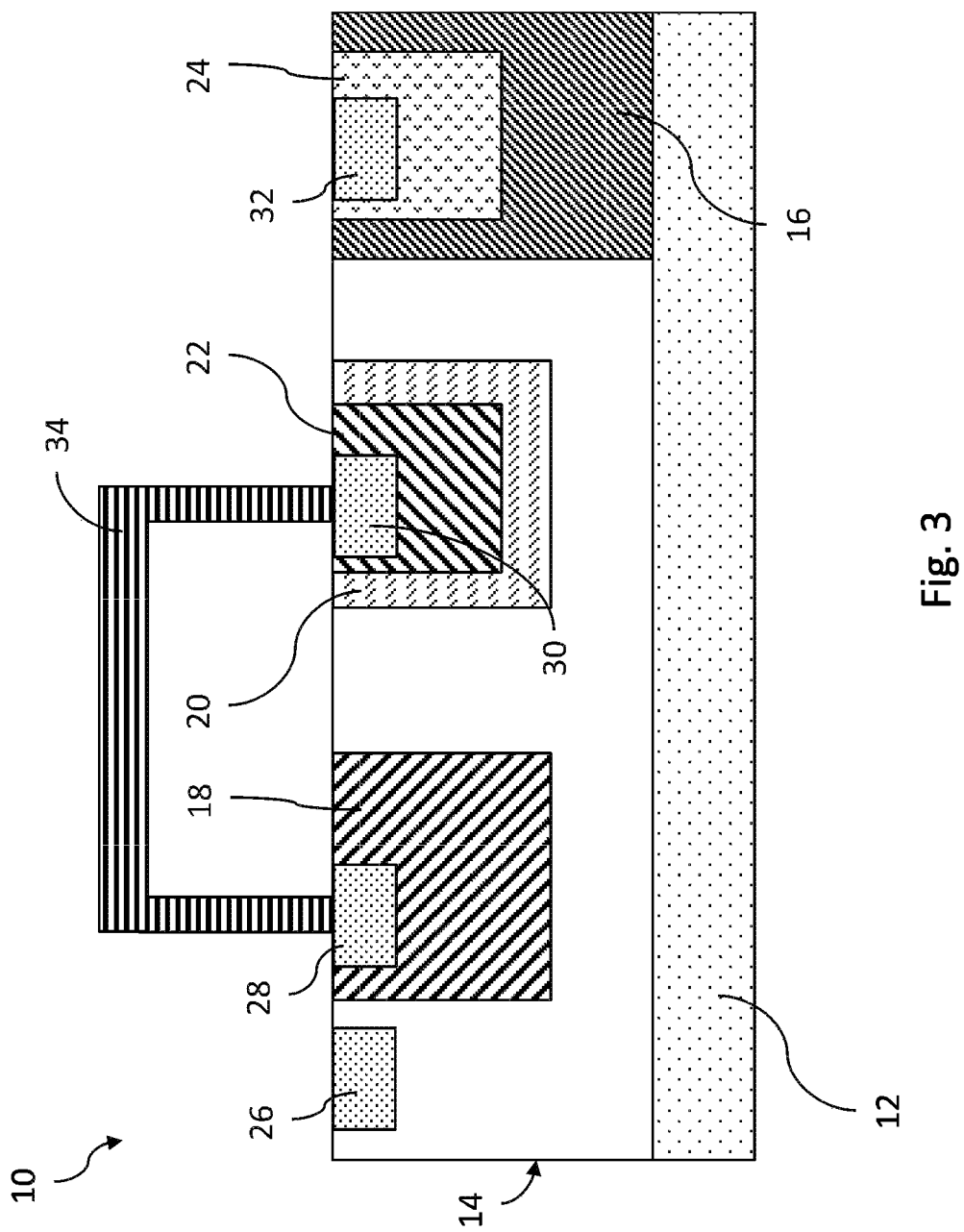
FIG. 3 is a diagram schematically the structure of a semiconductor structure with current flow path direction controlling according to a third embodiment of the present invention.
Figure 4:
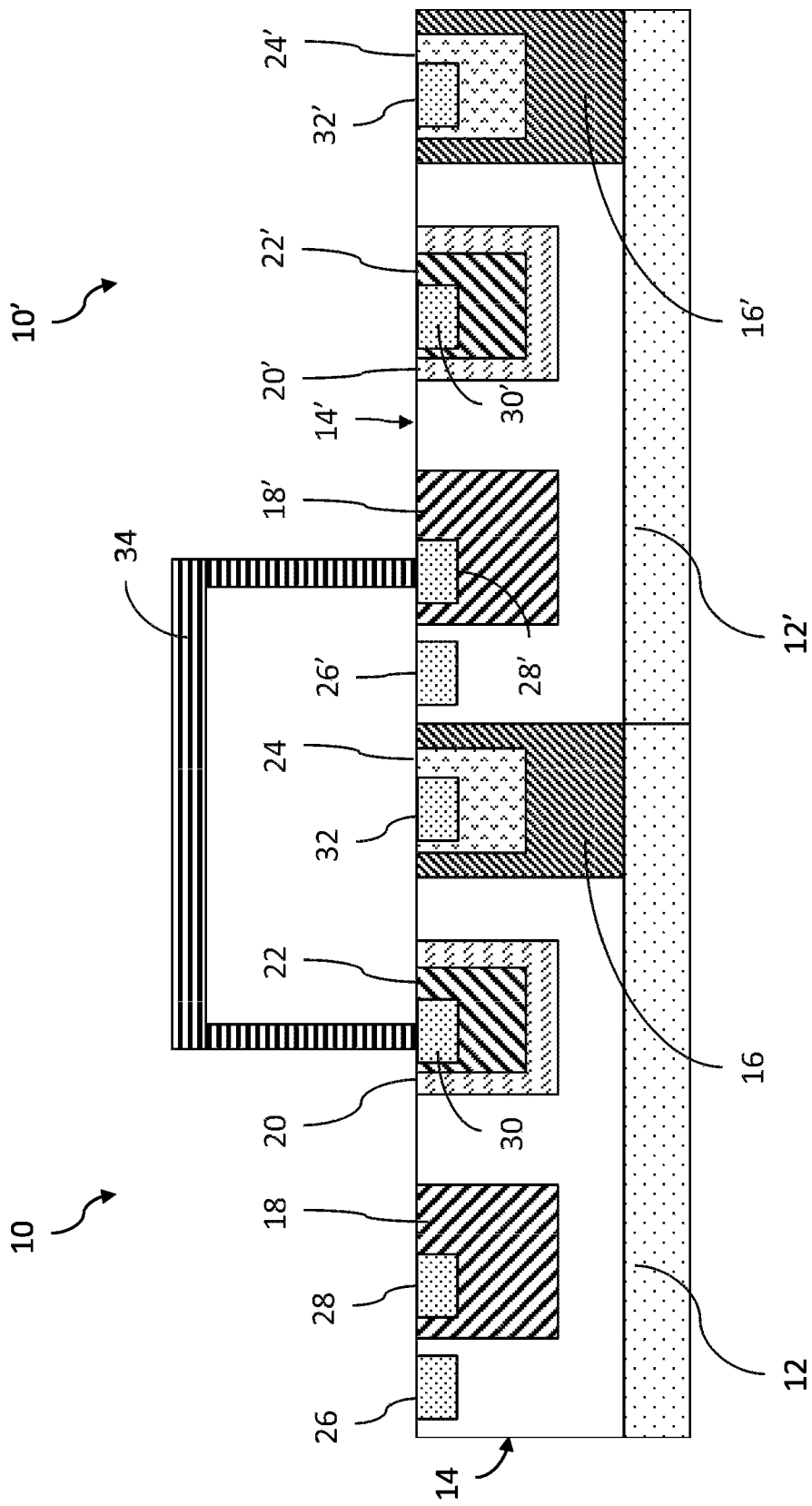
FIG. 4 is a diagram schematically the structure of a semiconductor structure with current flow path direction controlling according to a four embodiment of the present invention.

Refer to FIG. 2 for a second embodiment of the present invention. Connection elements 26, 28, 30 and 32 may be selectively arranged on the tops of the epitaxial layer 14, second doped region 18, fourth doped region 22 and fifth doped region 24, The connection elements 26, 28, 30 and 32 may be connected with each other or connected with external structures. For example, the connection element 28 is connected with the exterior through a metal element 34. Refer to FIG. 3 for a third embodiment of the present invention. Alternatively, the connection element 28 is electrically connected with the connection element 30 through a metal element 34. However, the present invention is not limited by the abovementioned embodiments. The user may determine the relationship of connection according to requirement. Refer to FIG. 4 for a fourth embodiment of the present invention. While more than two semiconductor structures, such as two semiconductor structures 10 and 10', are joined together, the connection elements 26, 28, 30, 32, 26', 28', 30', and 32' may be selectively electrically connected with each other. For example, the connection element 30 is electrically connected with the connection element 28' through a metal element 34. In the present invention, each of the connection elements 26, 28, 30, 32, 26', 28', 30', and 32' may be a PN diode, a Schottky diode, a fast recovery diode (FRD), a transistor, a thyristor, a metal-oxide-semiconductor field-effect-transistor (MOSFET), or an insulated gate bipolar transistor (IGBT).

The adoption of a connection element or the type of a connection element is not particularly limited by the present invention but dependent on the requirement of users or the process of fabrication.

Figure 5:
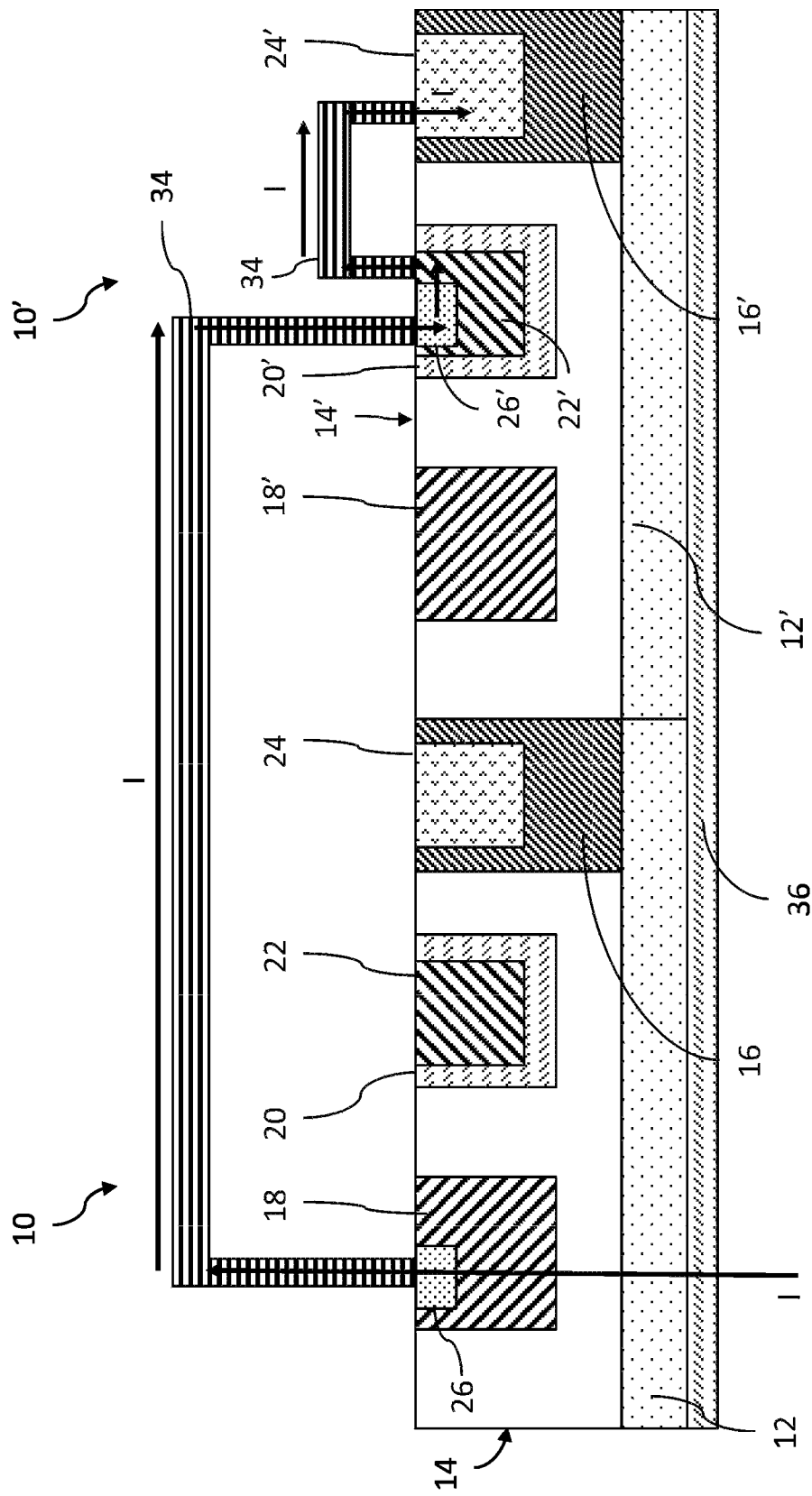
FIG. 5 is a diagram schematically that a current is introduced into the structure of a semiconductor structure with current flow path direction controlling according to a fifth embodiment of the present invention.

Refer to FIG. 5 for a fifth embodiment, which is used to demonstrate the method for controlling current flow path. In the fifth embodiment, the substrate 12 is connected with an external metal layer 36 and receives a current I through the external metal layer 36. The current I may be selectively transmitted from the epitaxial layer 14, the first doped region 16, the second doped region 18, the third doped region 20, the fourth doped region 22, and the fifth doped region 24. For example, the second doped region 18 has a connection element 26, and the connection element 26 is electrically connected with a connection element 26' of a fourth doped region 22' of an external semiconductor structure 10' through a metal element 34, whereby the current I is blocked by the first doped region 16 and would not be transmitted to the exterior. Further, the current I flows from the second doped region 18 through the connection element 26 and the metal element 34 to the connection element 26' in the fourth doped region 26'. Furthermore, the current I may flow from the fourth doped region 22' through a metal element 34' to the fifth doped region 24'. The present invention is characterized in using the conductivity types of the epitaxial layer and the doped regions to control the current flow path. The user may design the fabrication process to realize a specified electric connection according to requirement.

Figure 6:
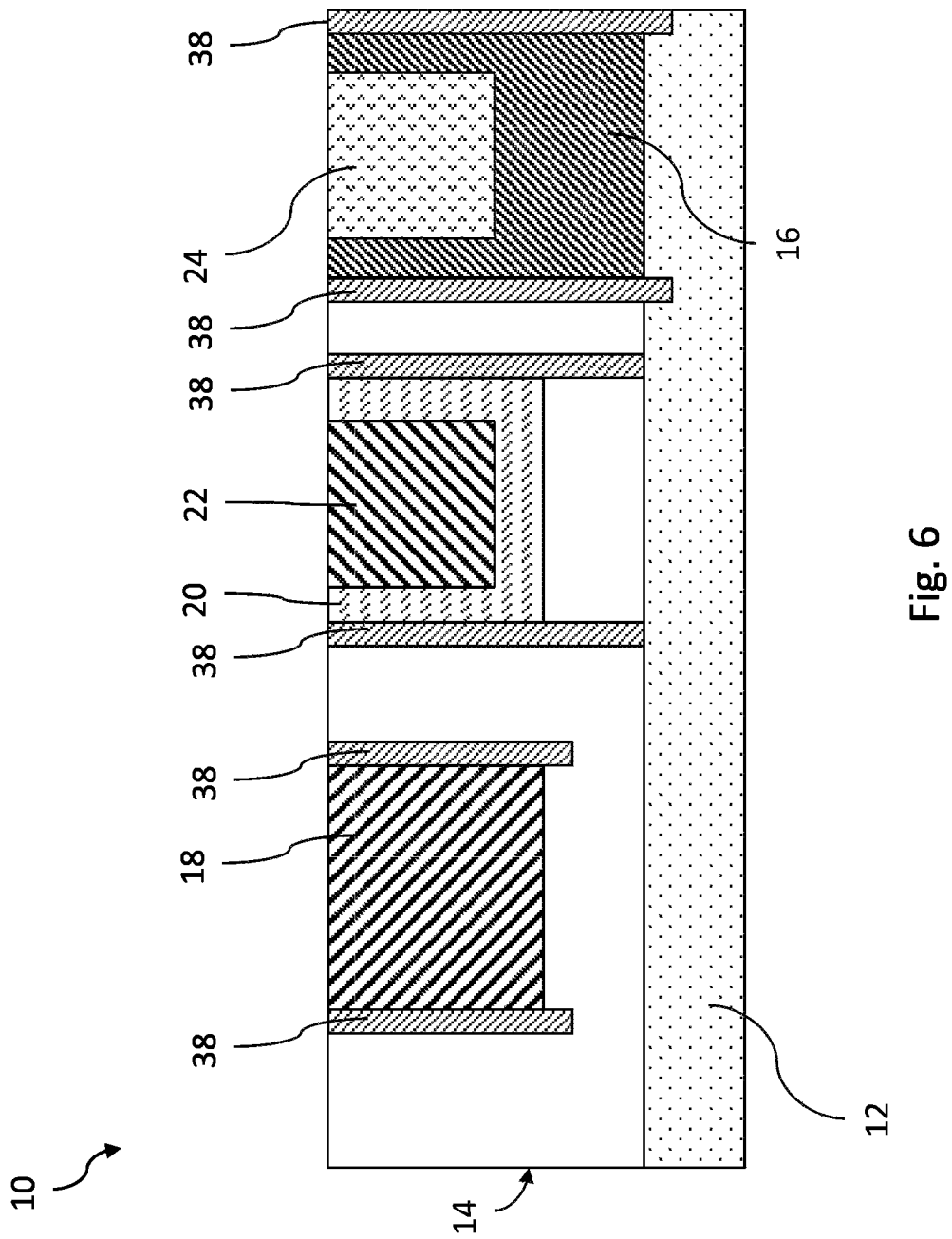
FIG. 6 is a diagram schematically the structure of a semiconductor structure with current flow path direction controlling according to a sixth embodiment of the present invention.

Refer to FIG. 6 for a sixth embodiment of the present invention. In the sixth embodiment, trench-type separation regions 38 are annularly arranged around the first doped region 16, the second doped region 18 and the third doped region 20. In the sixth embodiment, a reactive-ion etching (RIE) process is used to etch a dielectric material, a polysilicon material or an amorphous silicon material to form the separation regions 38 around the first doped region 16, the second doped region 18 and the is third doped region 20. In the present invention, the angle of the sidewall of the separation region 38 ranges from 55 to 125 degrees. In the sixth embodiment, the angle of the sidewall is 90 degrees. However, the present invention does not particularly limit the material, depth or sidewall angle of the separation region 38. In the present invention, the separation region 38 is used to block current lest the current stray away from the first doped region 16, the second doped region 18 and the third doped region 20.

Figure 7A:
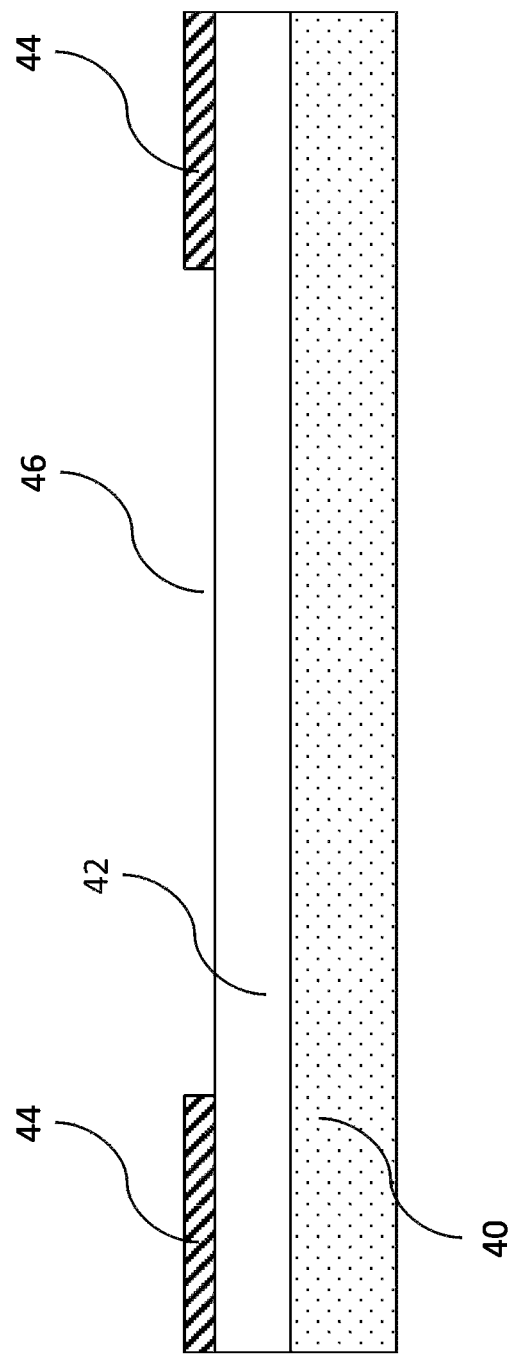
FIGS. 7a-7d are diagrams schematically showing the steps of fabricating the epitaxial layer and doped regions according to one embodiment of the present invention.
Figure 7B:
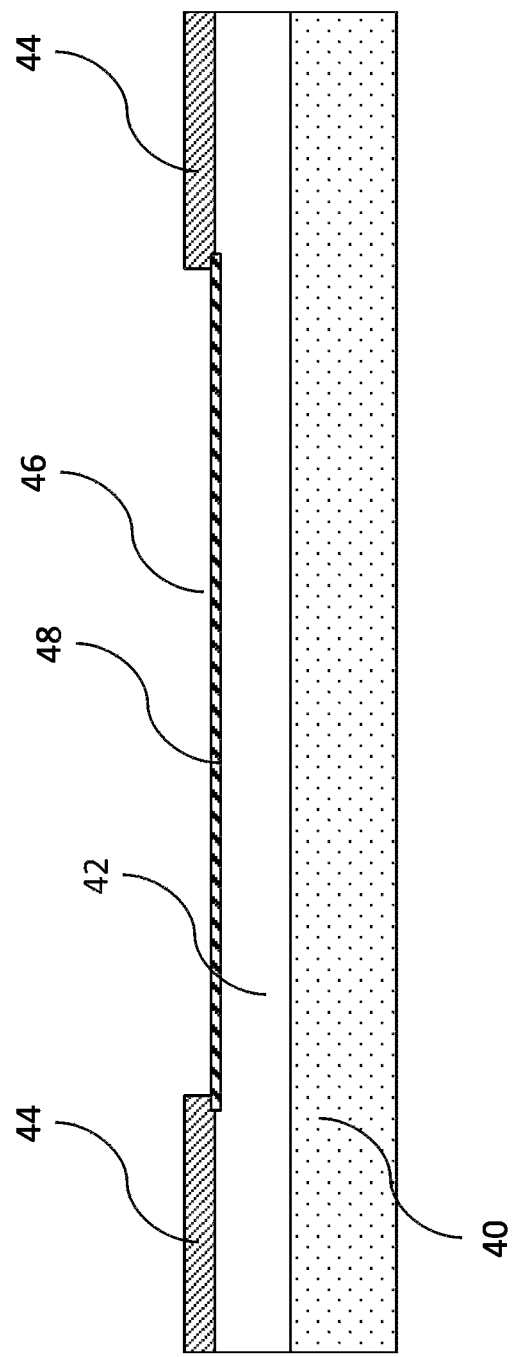
Figure 7C:
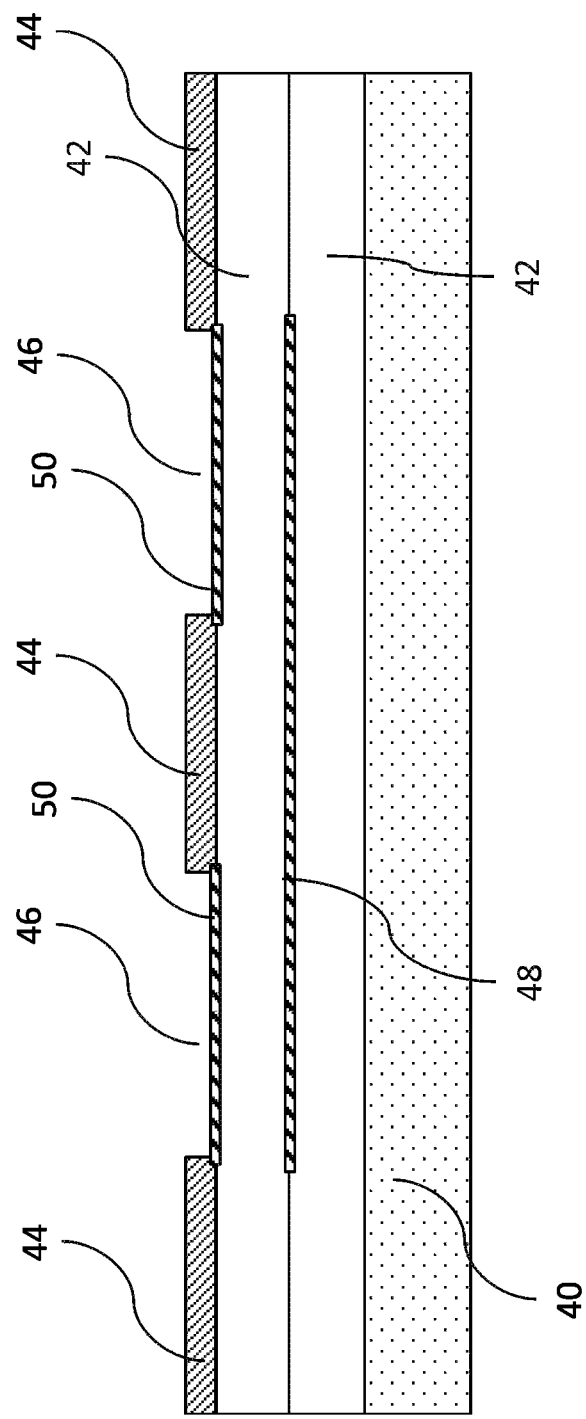
Figure 7D:
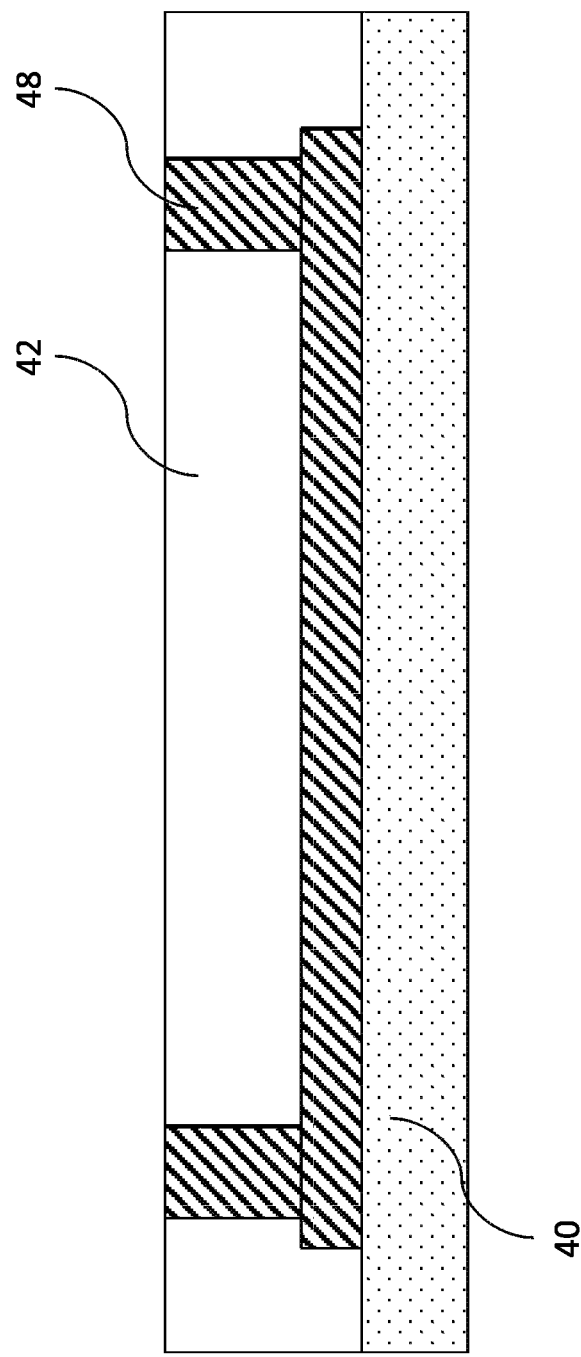
Figure 8A:
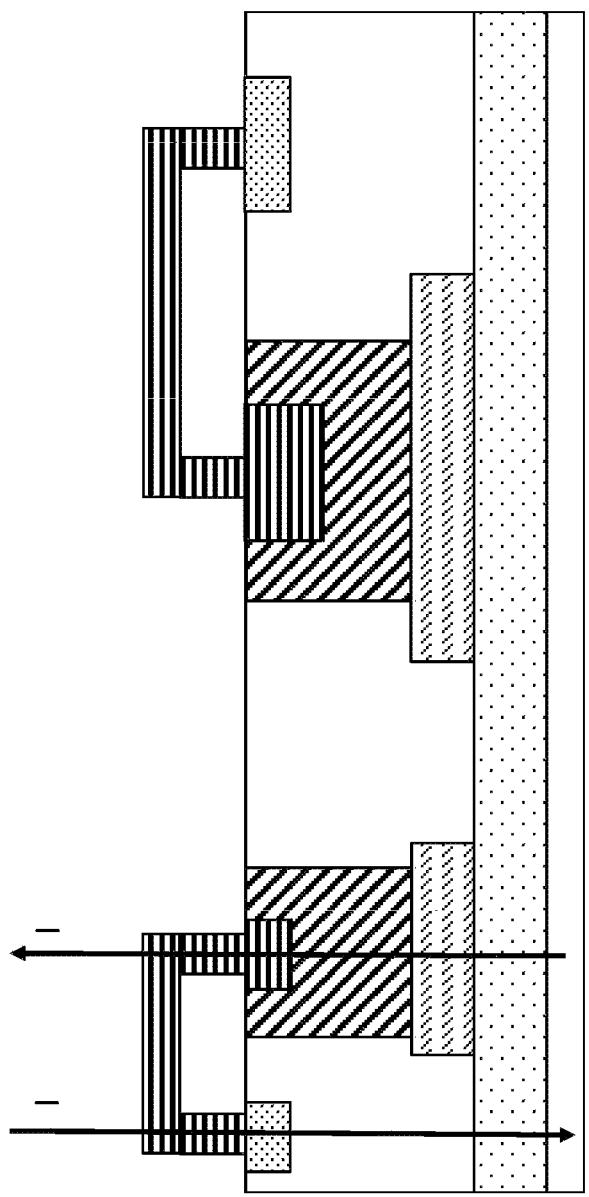
FIGS. 8a-8g are diagrams schematically showing practical applications of separation regions according to embodiments of the present invention.
Figure 8B:
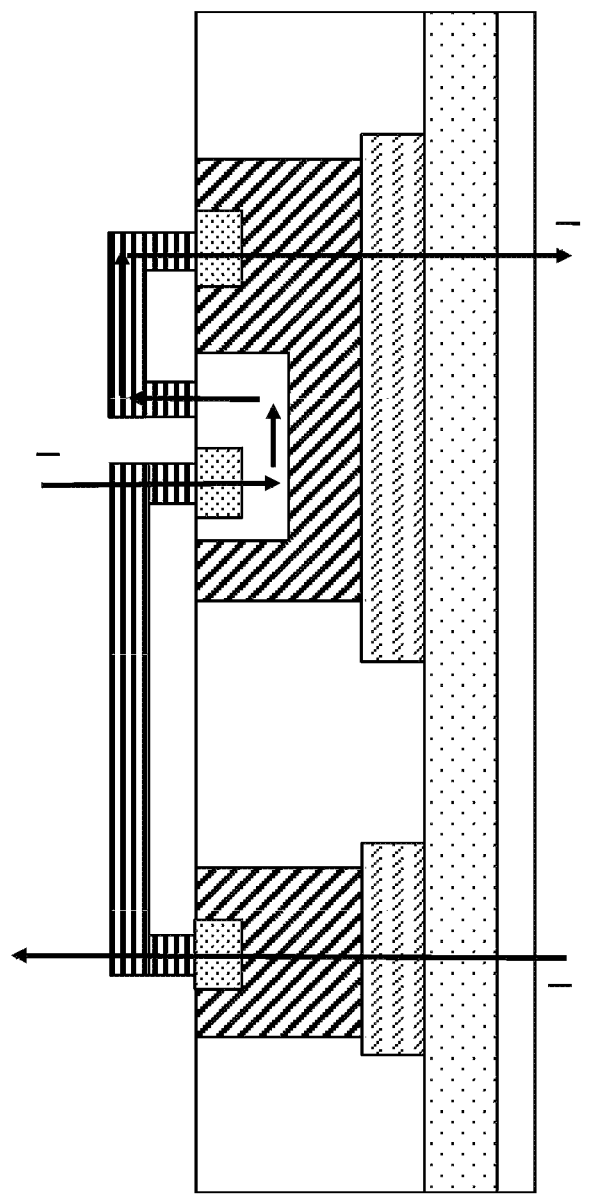
Figure 8C:
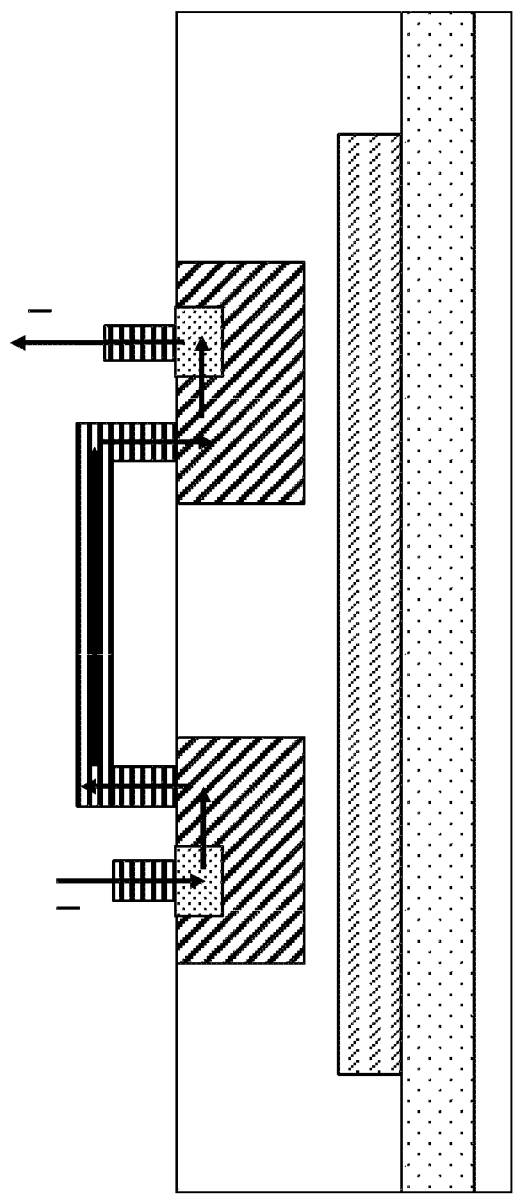
Figure 8D:
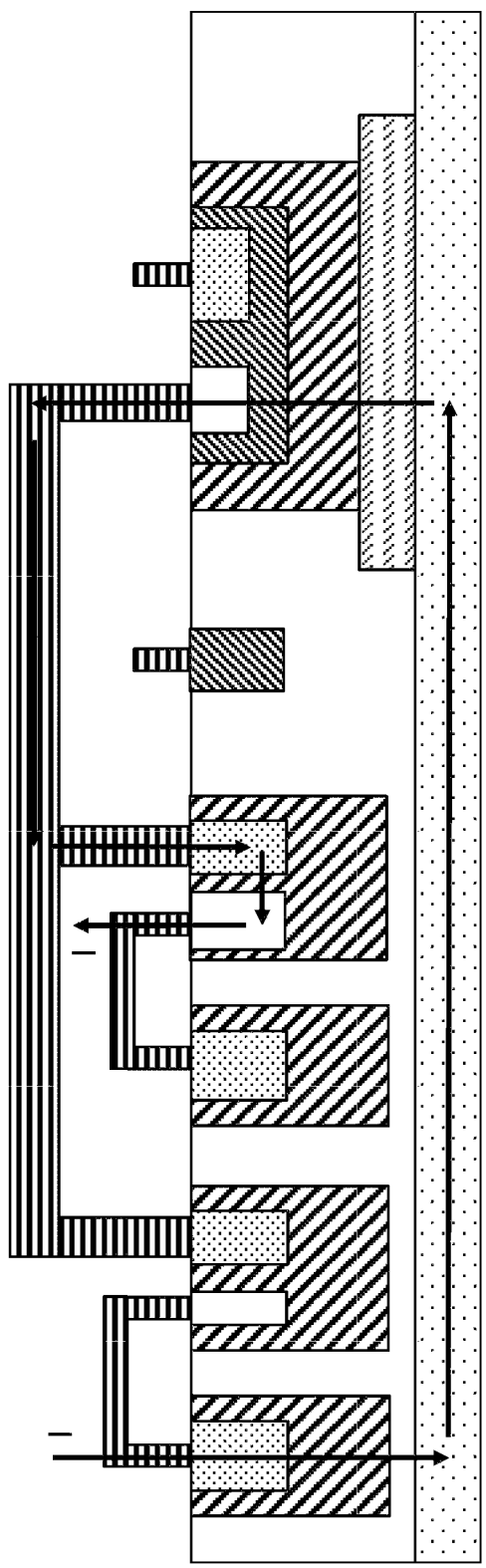
Figure 8E:
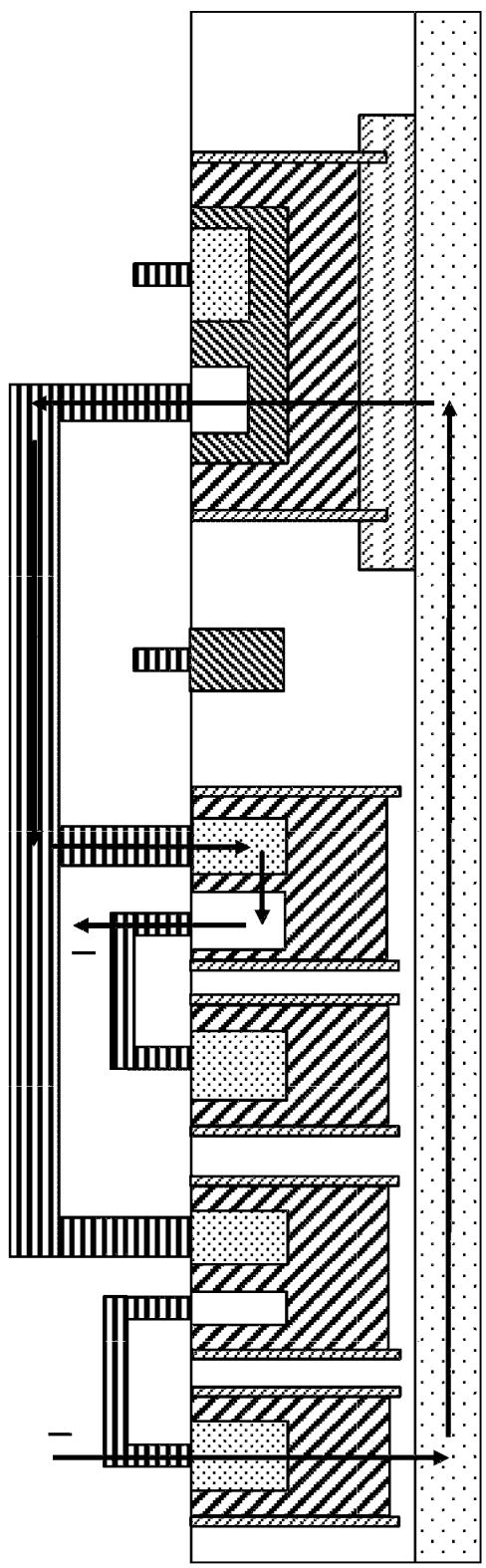
Figure 8F:
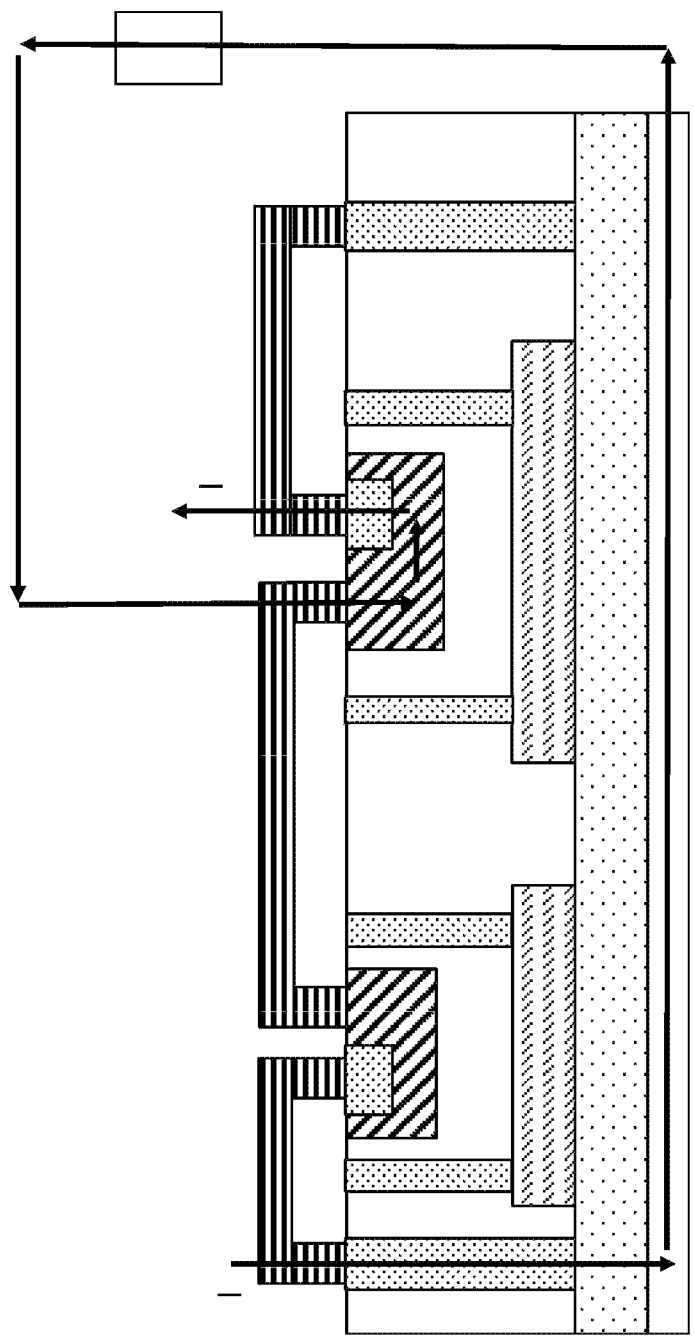
Figure 8G:
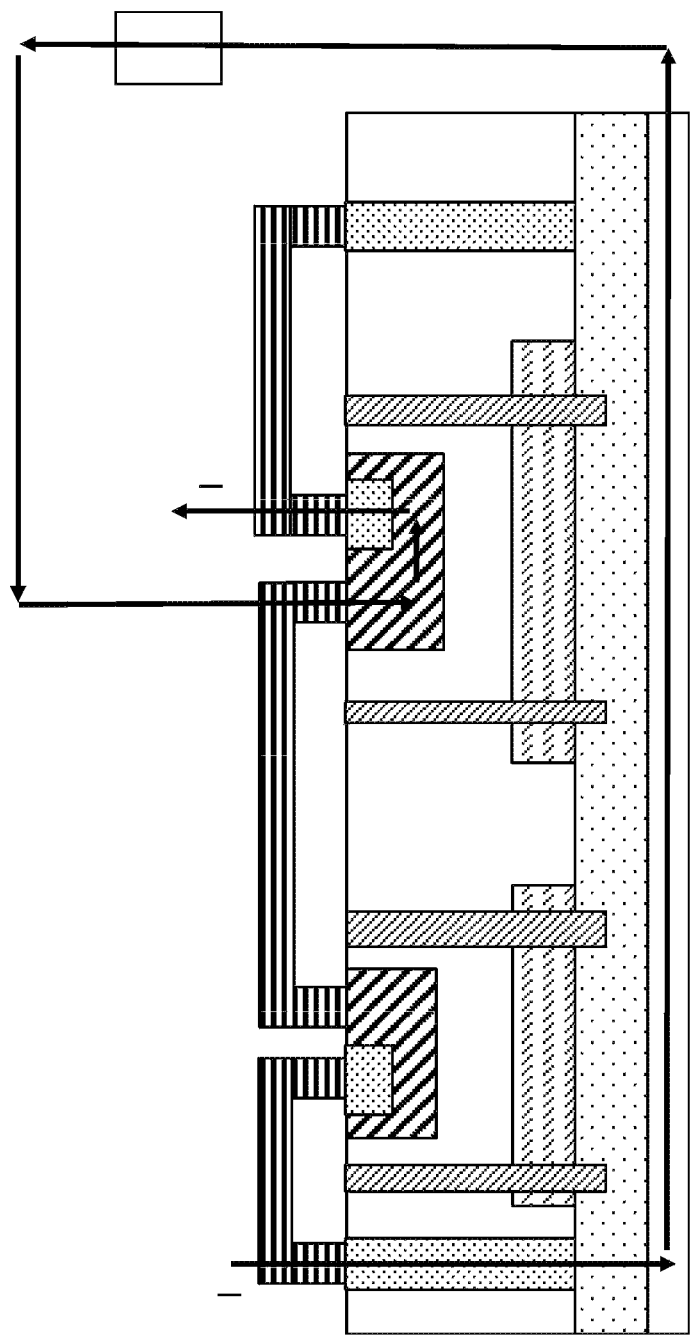

In general, an etching process is used to etch an object downward and/or laterally to form a desired structure. Refer to FIGS. 7a-7d diagrams schematically the steps of fabricating the epitaxial layer and the doped regions. Firstly, form an epitaxial layer 42 on a substrate 40, and form a silicon dioxide photomask 44 with an implant window 46, as shown in FIG. 7a. Next, form a first doped region 48 in the implant window 46, wherein the conductivity type of the first doped region 48 is identical to or different from the conductivity type of the epitaxial layer 42, as shown in FIG. 7b. Next, remove the silicon dioxide photomask 44, and undertake deposition on the epitaxial layer 42 and the first doped region 48 to form the structure shown in FIG. 7c Next, form a silicon dioxide photomask 44 with an implant window 46 over the first doped region 48 again. Next, implant a dopant through the implant window 46 to form a second doped region 50 with a conductivity type opposite to the conductivity type of the first doped region 48. The step in FIG. 7c is repeated several times according to requirement to form a thicker first doped region 48 and a thicker second doped region 50, as shown in FIG. 7d. According to the steps described above, the present invention can fabricate the epitaxial layer and the doped regions to realize the semiconductor structure with current flow path direction controlling. Further, according to the steps described above, the present invention may also form the semiconductor structures with separation regions, as shown in FIGS. 8a-8f, whereby to control the flow path of the current I.

Because of complexity of electronic device design, the present invention does not particularly limit the way of connecting the connection elements or the quantity of the semiconductor structures assembled together. The present invention mainly discloses a semiconductor structure with a special structural relationship and a special conductivity type relationship of the epitaxial layer and the doped regions to guarantee that the current would not stray to other paths. While applied to various electronic devices, the semiconductor structure of the present invention is free from mutual interference of current transmission and able to upgrade the performance of electronic devices.

The embodiments have been described above to demonstrate the technical thoughts and characteristics of the present invention to enable the persons skilled in the art to understand, make, and use the present invention. However, these embodiments are not intended to limit the scope of the present invention. Any equivalent modification or variation according to the spirit of the present invention is to be also included by the scope of the present invention.

What is claimed is:

1. A semiconductor structure with current flow path direction controlling, comprising
   a substrate;
   an epitaxial layer on said substrate and of a first conductivity type;
   a first doped region on said substrate, at one side of said epitaxial layer, and of said first conductivity type or a second conductivity type;
   a second doped region in said epitaxial layer, enclosed by said epitaxial layer, and of said second conductivity type, wherein a top of said second doped region is revealed from a top of said epitaxial layer;
   a third doped region in said epitaxial layer, between said second doped region and said first doped region, and of said second conductivity type, wherein said epitaxial layer separates said third doped region, said second doped region and said first doped region, and wherein a top of said third doped region is revealed from said top of said epitaxial layer;
   a fourth doped region in said third doped region, enclosed by said third doped region, and of said first conductivity type, wherein a top of said fourth doped region is revealed from said top of said third doped region; and
   a fifth doped region in said first doped region, enclosed by said first doped region, and of a conductivity type opposite to a conductivity type of said first doped region, wherein a top of said fifth doped region is revealed from a top of said first doped region, and wherein while said substrate receives a current, said current is selectively transmitted from said epitaxial layer, said first doped region, said second doped region, said third doped region, said fourth doped region, or said fifth doped region, and wherein a flow path direction of said current is controllable;

wherein, separation regions are annularly arranged around said first doped region, said second doped region, and said third doped region to prevent said current from straying to exterior of said first doped region, said second doped region, and said third doped region.

2. The semiconductor structure with current flow path direction controlling according to claim 1, wherein said first conductivity type is an n conductivity type, and said second conductivity type is a p conductivity type.

3. The semiconductor structure with current flow path direction controlling according to claim 1, wherein said first conductivity type is a p conductivity type, and said second conductivity type is an n conductivity type.

4. The semiconductor structure with current flow path direction controlling according to claim 1, wherein said substrate is of said first conductivity type or said second conductivity type.

5. The semiconductor structure with current flow path direction controlling according to claim 1, wherein said separation region is made of a dielectric material, a polysilicon material or an amorphous silicon material.

6. The semiconductor structure with current flow path direction controlling according to claim 1, wherein a reactive-ion etching (RIE) process is used to fabricate said separation regions.

7. The semiconductor structure with current flow path direction controlling according to claim 1, wherein an angle of a sidewall of said separation region ranges from 55 to 125 degrees.

8. A semiconductor structure with current flow path direction controlling, comprising
   a substrate;
   an epitaxial layer on said substrate and of a first conductivity type;
   a first doped region on said substrate, at one side of said epitaxial layer, and of said first conductivity type or a second conductivity type;
   a second doped region in said epitaxial layer, enclosed by said epitaxial layer, and of said second conductivity type, wherein a top of said second doped region is revealed from a top of said epitaxial layer;
   a third doped region in said epitaxial layer, between said second doped region and said first doped region, and of said second conductivity type, wherein said epitaxial layer separates said third doped region, said second doped region and said first doped region, and wherein a top of said third doped region is revealed from said top of said epitaxial layer;
   a fourth doped region in said third doped region, enclosed by said third doped region, and of said first conductivity type, wherein a top of said fourth doped region is revealed from said top of said third doped region; and
   a fifth doped region in said first doped region, enclosed by said first doped region, and of a conductivity type opposite to a conductivity type of said first doped region, wherein a top of said fifth doped region is revealed from a top of said first doped region, and wherein while said substrate receives a current, said current is selectively transmitted from said epitaxial layer, said first doped region, said second doped region, said third doped region, said fourth doped region, or said fifth doped region, and wherein a flow path direction of said current is controllable;

wherein, connection elements are selectively arranged on tops of said epitaxial layer, said first doped region, said second doped region, said third doped region, said fourth doped region and said fifth doped region, and wherein said epitaxial layer, said first doped region, said second doped region, said third doped region, said fourth doped region and said fifth doped region are selectively electrically connected through said connection elements.

9. The semiconductor structure with current flow path direction controlling according to claim 8, wherein each of said connection elements may be a PN diode, a Schottky diode, a fast recovery diode (FRD), a transistor, a thyristor, a metal-oxide-semiconductor field-effect-transistor (MOSFET), or an insulated gate bipolar transistor (IGBT).

* * * * *